US010535936B2

(12) United States Patent
Webber et al.

(10) Patent No.: US 10,535,936 B2
(45) Date of Patent: Jan. 14, 2020

(54) ELEMENT, SYSTEM AND METHOD FOR RETAINING A COMPONENT TO A SURFACE

(71) Applicant: HARWIN PLC, Portsmouth, Hampshire (GB)

(72) Inventors: Robert Webber, Portsmouth (GB); Sam Bennett, Portsmouth (GB); Mark Plested, Portsmouth (GB); Andrew McQuilken, Portsmouth (GB)

(73) Assignee: HARWIN PLC, Hampshire (GB)

( * ) Notice: Subject to any disclaimer, the term of this patent is extended or adjusted under 35 U.S.C. 154(b) by 0 days.

(21) Appl. No.: 16/224,959

(22) Filed: Dec. 19, 2018

(65) Prior Publication Data

US 2019/0190174 A1    Jun. 20, 2019

(30) Foreign Application Priority Data

Dec. 19, 2017    (GB) .................................. 1721335.6

(51) Int. Cl.
*H01R 12/71*    (2011.01)
*G06F 1/18*    (2006.01)
*H01R 12/70*    (2011.01)

(52) U.S. Cl.
CPC .......... *H01R 12/712* (2013.01); *G06F 1/182* (2013.01); *H01R 12/7011* (2013.01)

(58) Field of Classification Search
CPC ................ H01R 12/712; H01R 13/648; H01R 13/6587; H01R 13/6581
(Continued)

(56) References Cited

U.S. PATENT DOCUMENTS 5,014,160 A * 5/1991 McCoy, Jr. ............ H05K 3/308
                                                      174/363
5,095,177 A * 3/1992 Johnson ................. H04B 15/02
                                                      174/372
(Continued)

FOREIGN PATENT DOCUMENTS

DE              3344418 A1    6/1985  ............... H05K 3/32

OTHER PUBLICATIONS https://www.youtube.com/watch?v=I4EGObpXz68 (Harwin) as cited in GB Search Report; published Jul. 8, 2014.
(Continued)

*Primary Examiner* — Tulsidas C Patel
*Assistant Examiner* — Peter G Leigh
(74) *Attorney, Agent, or Firm* — Renner Kenner Greive Bobak Taylor & Weber

(57) ABSTRACT

The invention relates to a system for retaining a component to a surface which includes a surface; a component; and at least two elements. Each element has a base connected to the surface, the at least two elements provide means for retaining the component to the surface, wherein a first means is biased to a first position in which the first means extend beyond an edge of a first base such that when the component is placed on the surface the first means are configured to move to a second position in order to retain the component in its position relative to the surface. The component provides at least one cavity defined by at least two inner faces, and wherein upon placement of the component on the surface, the base of each element is situated solely within the at least one cavity of the component.

18 Claims, 3 Drawing Sheets

(58) Field of Classification Search
USPC .................................................. 439/607.01
See application file for complete search history.

(56) References Cited

U.S. PATENT DOCUMENTS

| | | | |
|---|---|---|---|
| 5,186,634 A | 2/1993 | Thompson ...................... 439/82 |
| 5,353,201 A * | 10/1994 | Maeda ................. H05K 9/0033 |
| | | 174/362 |
| 5,545,843 A * | 8/1996 | Arvidsson ............ H05K 9/0016 |
| | | 174/355 |
| 6,181,573 B1 * | 1/2001 | Riet ..................... H05K 9/0032 |
| | | 174/353 |
| 6,320,121 B1 * | 11/2001 | Honeycutt ........... H05K 9/0032 |
| | | 174/371 |
| 7,491,899 B2 * | 2/2009 | Zuehlsdorf .............. H04B 1/40 |
| | | 174/372 |
| 7,501,587 B2 * | 3/2009 | English ................ H05K 9/0032 |
| | | 174/354 |
| 8,009,441 B2 * | 8/2011 | Clancy .................. G06K 7/0021 |
| | | 361/816 |
| 8,542,498 B2 * | 9/2013 | Su ........................ H05K 9/0032 |
| | | 361/816 |
| 8,817,489 B2 * | 8/2014 | Yang ...................... H05K 1/144 |
| | | 361/816 |
| 9,370,131 B2 * | 6/2016 | Konda ................. H05K 9/0022 |
| 9,549,491 B2 * | 1/2017 | Kurita ..................... F16B 2/245 |
| 2003/0000739 A1 | 1/2003 | Frutschy et al. .............. 174/260 |
| 2009/0181562 A1 | 7/2009 | Croy et al. ....................... 439/83 |
| 2011/0188226 A1 * | 8/2011 | Kim .......................... H05K 9/00 |
| | | 361/818 |
| 2013/0148318 A1 * | 6/2013 | Kim ..................... H05K 9/0035 |
| | | 361/759 |
| 2013/0280968 A1 * | 10/2013 | Kurita ...................... H01R 4/48 |
| | | 439/863 |
| 2016/0099525 A1 * | 4/2016 | Kurita .................. H05K 9/0035 |
| | | 439/83 |
| 2016/0150685 A1 * | 5/2016 | Kurita .................. H05K 9/0016 |
| | | 174/384 |
| 2017/0135200 A1 * | 5/2017 | Chang ....................... F16B 2/22 |
| 2017/0156241 A1 * | 6/2017 | Tsai ...................... H05K 9/0032 |

OTHER PUBLICATIONS

GB Search Report dated Jun. 19, 2018 in related application No. GB1721335.6.

* cited by examiner ated with the present invention described below.
ELEMENT, SYSTEM AND METHOD FOR RETAINING A COMPONENT TO A SURFACE

FIELD OF INVENTION

The invention relates to removably retaining a component to a surface, in particular for the retention of a shield can to a printed circuit board (PCB).

BACKGROUND

In order to shield electronic components on a PCB in electronic devices against Electromagnetic Interference (EMI) or Radio Frequency Interference (RFI), shielding in the form of an electrically conductive shield can or box is commonly placed on the PCB so as to cover the electronic components to be shielded. EMI or RFI can be caused by external influences, or by other parts of the electronic circuit itself, such as antennas or power supplies.

Shielding can be achieved when a closed metal can with a free rim at downwardly extending side pieces is soldered to the PCB along the entire free edge of the metal can. A critical requirement that must be fulfilled in order to achieve good shielding is that the connection between the shield can free edges and the PCB is well controlled. If any areas of the free edges are not in contact with the PCB creating an electrical contact, the shielding efficiency is influenced by the largest gap between the shield can and the PCB. Therefore, if gaps exist between the shield can and the PCB, the sizes of these must be well defined. A disadvantage of directly soldering the shield can to the PCB is in the difficulty of removing the shield can once it has been attached. Some arrangements include a soldered cage around the PCB, with a removable cap to make up the shield can. This arrangement provides the permanent fixture of the shield can, whilst permitting access to the PCB; however the permitted access is limited by the soldered cage.

Soldering is not the only method of mounting a shield can to a PCB; other methods include the use of shield clips fixed to the PCB, an example of which is shown in FIG. 1. The shield clips "pinch" the free edges of the shield can, the shield clips applying a force to two opposite faces of a free edge of the shield can in order to retain its position. Using shield clips provides the advantage of removably securing the shield can to the PCB. A disadvantage of such methods is that the permitted thickness of the shield can is limited by the size of the shield clips. Also, since the shield can typically sits on top of the base of the shield clip, and not flush with the PCB itself, gaps will exist between the shield can and the PCB, reducing the Electromagnetic Compatibility (EMC) performance of the shield can. The use of shield clips can also increase the space required to fit the shield can on the PCB. In today's world, there is a constant need to reduce the size of electronic circuits, including PCBs; any arrangement that reduces the space requirements for a shield can on a PCB is highly desirable.

There also remains a need to provide removable retention of a PCB shield can, whilst maintaining EMC performance.

SUMMARY OF THE INVENTION

According to a first aspect, the present invention provides a system for retaining a component to a surface, according to appended claim 1. According to a second aspect, the present invention provides an element for use in the system of any preceding claim, according to appended claim 15. From a third aspect, the present invention provides a system for retaining a component to a surface, according to appended claim 18. Further optional features are provided in the appended dependent claims.

BRIEF DESCRIPTION OF THE DRAWINGS

Embodiments of the present invention are now described, by way of example only, with reference to the accompanying drawings, in which.

DETAILED DESCRIPTION OF EMBODIMENTS

Figure 1:
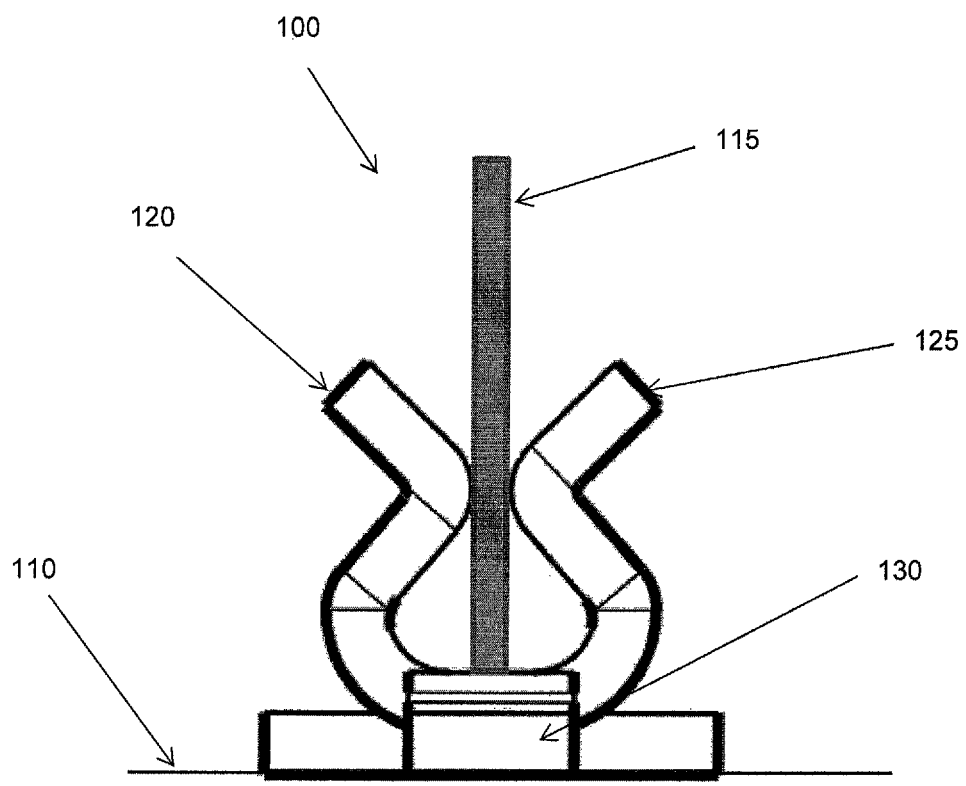
FIG. 1 is a shield clip retention arrangement known in the prior art.

FIG. 1 shows a prior art retention system 100 which uses a shield clip to secure a shield can wall 115 to a surface 110, for example the surface of a PCB. The shield clip includes a base 130 connected to the surface 110, the base 130 comprising two resilient elements 120, 125 biased towards one another to form a clip. When the shield can wall 115 is inserted between the two elements 120, 125 causing them to move outwards, the two elements 120, 125 exert a biasing force against the two sides of the shield can wall 115 in order to retain the shield can wall's 115 position on the surface 110. This arrangement comprises a number of disadvantages, as mentioned above, which are overcome by the present invention described below.

The component retention system according to a first embodiment of the invention will now be described with reference to FIG. 2. In the present embodiment, component retention system 200 includes at least two resilient clip elements 205, 210, each comprising a base 235, 240 and a resilient spring portion 245, 250. The bases of the at least two resilient clip elements are attached to a surface 230, and positioned with respect to one another on the surface in such a way as to enable the resilient spring portions 245, 250 to frictionally retain a component 215 in position adjacent to the surface 230. The component 215 in the present embodiment is a shield can to be retained to a Printed Circuit Board (PCB) (surface 230) for protecting an electrical circuit (situated on the circuit board) from electromagnetic interference (EMI). The shield can is a hollow cuboid with at least one open face so as to allow it to shield an electrical circuit on the surface 230. The shield can 215 comprises at least two free faces 220, 225 (either two inner faces or two outer faces) having lowermost edges that may simultaneously remain in contact with the surface 230 and permit the bases 235, 240 of respective resilient clip elements to be situated in very close proximity with the at least two free faces 220, 225 upon retention of the component on the surface 230. The term "free face" used in this application refers to a face 220, 225 of the component 215 suitable for contact with the resilient spring portions 245, 250 for securing the component 215 to the surface 230.

In the present embodiment, the shield can 215 comprises 8 free faces 220, 225: 4 inner faces (internal to the shield can 215) and 4 outer faces (external to the shield can 215). In the present embodiment, bottom edges of all free faces 220, 225 (inner and outer faces) of the shield can 215 are in direct contact with the PCB 230 during retention; this allows the shield can to fit flush to the PCB, resulting in greater electromagnetic compatibility EMC performance.

It will be appreciated that other shield can geometries may be used with the present embodiment, for instance a hollow cube, a hollow triangular cuboid or a hollow dome shaped component could also be used, each having at least one open face so as to allow it to shield an electrical circuit on the surface 230. Further, although a shield can enclosure is described in the present embodiment as component 215, it will be understood by the skilled person with the benefit of the present disclosure, other types of enclosure that protect an electrically conductive area on a surface from electromagnetic interference can be provided as the protective component.

The shield can is made from an electrically conductive material so as to protect the shielded circuit from electromagnetic interference (EMI). In particular, the can will protect or shield the circuit contained within it from receiving electromagnetic waves originating from outside the can (and also prevent electromagnetic waves originating inside the can from exiting).

The present invention is not limited to use in securing a shield can however, as any sort of component 215 may be retained to a surface using the system provided in this application. For instance, the component 215 to be secured may not be a shield against EMI, but a cover to prevent ingress of dust or water. The component 215 need not be hollow. The component 215 may be an electrical component such as a capacitor, Integrated circuit chip or transistor chip. A requirement of the component 215 is that it comprises at least two free faces 220, 225 each to be situated adjacent to a respective one of the at least two elements 205, 210. The at least two free faces 220, 225 may be situated on the outer free faces of the component, on an inner free face defining at least one cavity 226 within the component 215, or a combination of outer and inner free faces of the component, for example, where more than one resilient clip element is acting on the same vertical arm of the component 215.

In the preferred embodiment, the at least two free faces 220, 225 of the component 215 are opposing free faces, however the more bases 235, 240 and free faces 220, 225 present, the greater the total retention force that can be provided.

It will be readily apparent to the skilled person in the art which components will be suitable for retention to a surface 230 using the means described in the present application.

In the present embodiment, the surface 230 is a PCB suitable for receiving the at least two bases 235, 240. Preferably the PCB has an even surface. However, so long as the at least two free faces 220, 225 of the component 215 may simultaneously remain in contact with the PCB upon retention of the component 215, any shape PCB may be used. For instance, the PCB may be uneven, bent or curved.

The present invention is not limited to retention of a component 215 to a PCB however. Any type of surface 230 suitable for receiving the at least two bases 235, 240 and allowing contact with the at least two free faces 220, 225 of the component 215 may also be used. For example, the surface 230 may be the ground or any foundation on which a component is to be retained; the surface 230 may even be a face of another component 215. The surface 230 need not be horizontal; the present invention may retain a component 215 to a vertical or tilted surface.

In the present embodiment, the resilient spring portions 245, 250 situated on the at least two bases 235, 240 are resilient elements, biased in a first position. Each of the at least two bases 235, 240 comprises an edge 255, 260 transverse to the surface 230 on which the at least two bases 235, 240 are to be situated. A first element 245, situated on a first base 235 has a first position extending beyond the edge 255 of the first base 235, in a direction parallel with the surface 230 on which the first base 235 is situated. The first element 245 of the present embodiment has a contact part 265 at the furthest point beyond the edge 255 of the first base 235 in a direction parallel to the surface 230 on which the first base 235 is situated.

Figure 2:
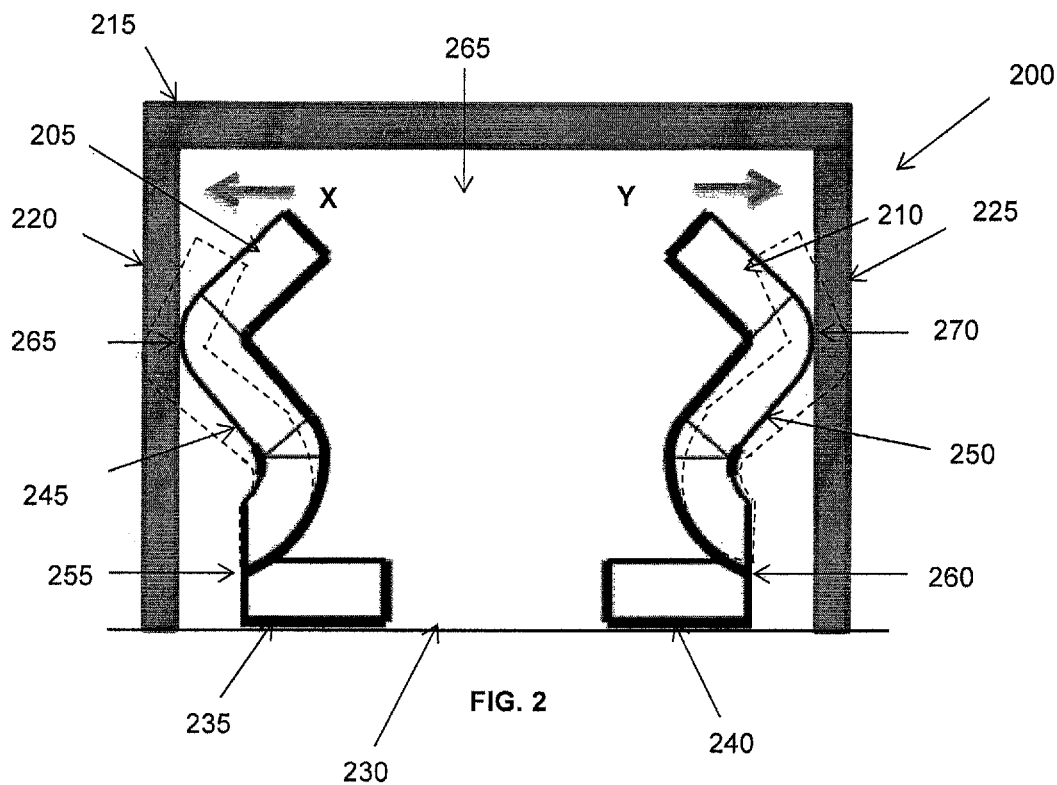
FIG. 2 is a spring pressure clip arrangement according to a first embodiment of the invention.

The resilient spring portions 245, 250 need not take the particular form shown in FIG. 2, and may consist of any other form of resilient elements suitable for providing the required lateral spring force. This lateral spring force is achieved where at least a component of the spring force provided by the resilient element acts in a direction parallel to the surface upon which the base is situated. The greater the component of the spring force acting in a direction parallel to the surface upon which the base is situated, the greater the retention force acting on the component retaining its position relative to the surface. These elements also need not be mounted on the surface 230 via the at least two bases 235, 240. In some embodiments the at least two elements 245, 250 may protrude from the surface 230 via one or more through holes in the surface 230. The at least two bases 235, 240 may either mount the at least two elements 245, 250 to a surface within the one or more through holes, or a surface on the other side of the one or more through holes. This may be beneficial in applications where surface space on the PCB is limited and cannot accommodate a base mounted to the surface of the PCB, wherein the use of the through hole embodiment would provide an alternative means to situate the at least two elements on the PCB.

The at least two bases 235, 240 are positioned on the surface 230 such that upon retention of the component 215, the elements 245, 250 are in contact with the free faces 220, 225 of the component 215. The distance between the at least two bases 235, 240 and their respective free faces 220, 225 of the component 215 may vary, but will be such to allow at least a part of the elements 245, 250 to contact the respective free faces of the component 215 and the part of the elements to provide a retention force on the component 215. The retention force provided by the elements 245, 250 is dependent on the distance between the at least two bases 235, 240 and their respective free faces 220, 225 of the component 215. This distance may be adjusted to accommodate different components 215 or requirements of the application of the clip elements 205, 210. For example, the retention force can be controlled by altering the distance between the clip elements or the distance between base portions and the respective free faces to provide a high retention force for a permanent retention of the component 215 or a low retention force for easy removal of the component 215. With removal retention of a component to a surface such as a printed circuit board, maintenance or fault finding on the surface can be aided given that the component can be removed.

In the present embodiment, a first element 245 is adapted to resiliently move from the first position (as shown by the phantom lines) to a second position upon receipt of one of the at least two free faces 220, 225 of the component 215 onto the surface 230. The resilient movement of the first element 245 from the first position to the second position results in the exertion of a biased force X from the contact part 265 of the element 245 against the respective free faces 220 of the component 215, in a direction towards the first position. Another one of the at least two elements 250 provides a retention force Y to at least another one of the at least two free faces 225, such that translational movement of the component 215 with respect to the surface 230 is restricted.

In the present embodiment, the at least two elements 245, 250 extend away from their respective bases 235, 240, wherein the contact parts 265, 270 are curved portions of the elements 245, 250, overhanging the edges 255, 260 of the respective bases 235, 240. It will be appreciated by the skilled person in the art that the contact part may take any shape so long as the element is biased such that the contact part extends beyond the respective edges 255, 260 of a base on which the contact parts 265, 270 are provided in a direction substantially parallel with the surface 230 on which the respective bases 235, 240 are situated.

Figure 3:
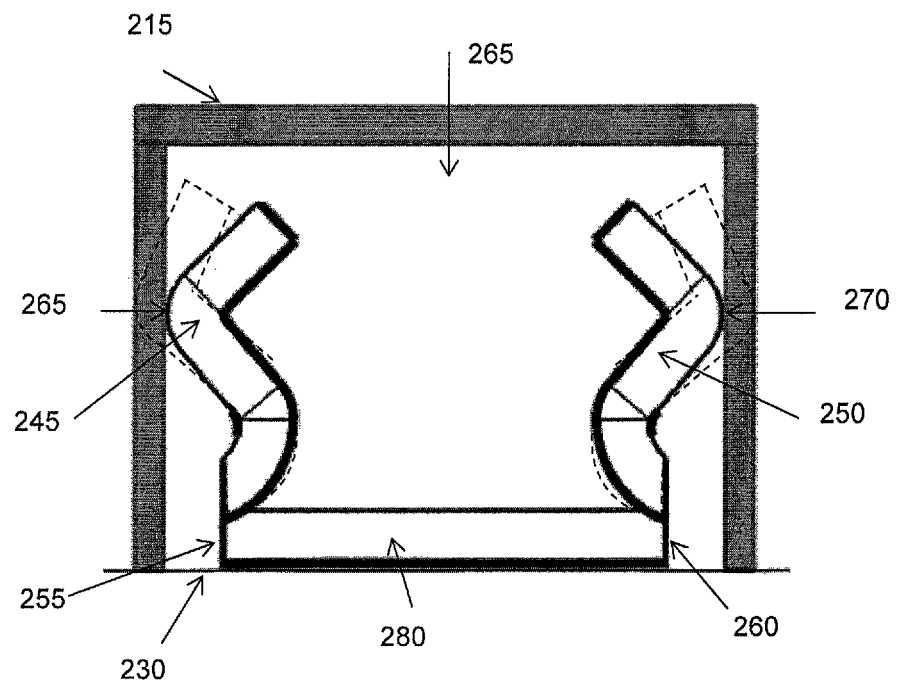
FIG. 3 is a spring pressure clip arrangement with the same retention means to that in FIG. 2 but situated on a single common base member.

As mentioned above, the resilient spring portions 245, 250 need not be mounted on the surface 230 via the at least two bases 235, 240. In a modification as shown in FIG. 3, a single base member 280 may be provided and the spring resilient portions 245, 250 are connected to the same base member 280, are located proximal each end of the base 280, and extend upwards from the base 280 at respective edges of the base 280. The base member may be adjustable/extendable (not shown) to vary the distance between the resilient spring portions. It will be appreciated by the skilled person that the functionality of the clip elements in FIG. 3 is otherwise the same as those shown and described in relation to FIG. 2 and the description is not repeated here.

Figure 4:
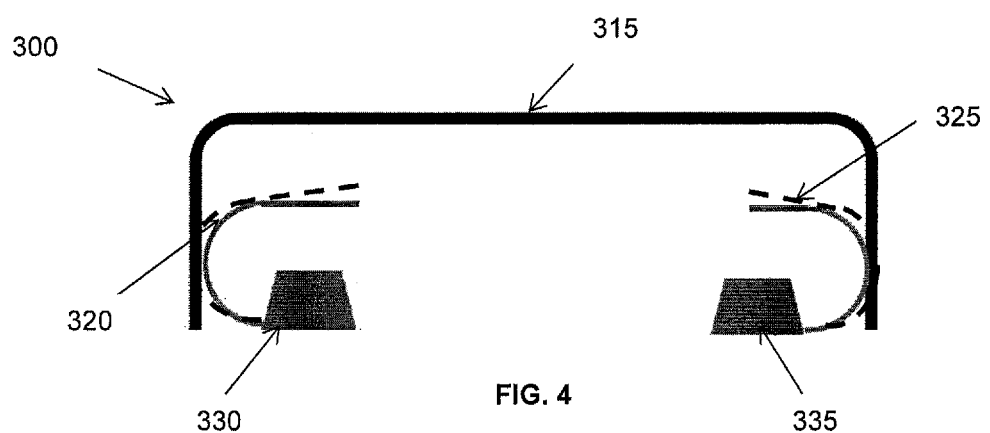
FIG. 4 is an alternative spring pressure clip arrangement in accordance with another embodiment.

For example, FIG. 4 illustrates an alternative embodiment where at least two elements 320, 325 (that have similar functionality to each other as the clip elements in FIG. 2 but in opposing orientations) extend from the edges of bases 330 and 335, the two elements being U-shaped resilient members in this embodiment but otherwise having the same functionality as the elements 245, 250. Upon contact with the free faces of the component 315, the at least two elements 320, 325 are moved to a second position from a first position (as shown by the phantom lines) in a direction back towards the bases 330, 335 in a similar manner that the elements 245, 250 move back towards their respective bases 330, 335.

The at least two elements of FIG. 2, 3, or 4 can be made of any material so long as they are not overly flexible (unable to provide a sufficient biasing force X) or overly rigid (immoveable through contact with a free face of the component). Although each clip element used in the pair to secure a component are shown as substantially the same, it will be appreciated by the skilled person that the clip element could have different styles and need not be identical in appearance.

The embodiments of the invention only require at least one of the at least two elements 245, 250 to provide a biased force X to at least one of the at least two free faces 220, 225 of the component 215. Any remaining elements 250 may only be required to provide the retention force Y to restrict translational movement of the component 215 due to the biased force X. The remaining elements 250 may simply take the form of rigid protrusions on the surface 230, acting as support elements against the at least two free faces 220, 225 of the component 215. In another embodiment, a second element 250 may also be adapted to resiliently move from a first position to a second position upon receipt of one of the at least two free faces 220, 225 of the component 215 onto the surface 230. The resilient movement of the second element 250 from the first position to the second position results in the exertion of a biased force Y against the respective free face 225 of the component 215 in a direction towards the first position, opposing the biased force X produced by another one of the at least two elements 220, resulting in restricted translational movement of the component 215 upon the surface 230. In the aforementioned embodiment, a greater retention force may be achieved due to the presence of multiple elements 245, 250, each providing a force contributing to the total retention force on the component 215. A greater retention force results in further translational movement restrictions on the component 215 in a direction parallel to the surface 230, as well as providing an increased frictional force preventing movement of the component 215 away from the surface 230 in a direction perpendicular to the surface.

The at least two elements 245, 250 can be situated either solely internal to, or solely external to the at least two free faces 220, 225 of the component 215, or a combination of internal and external to faces of the component 215 in order to retain the component 215 (for example, one or more clip elements 205, 210 acting on the same vertical arm of the component 215). In the embodiment of FIG. 2, the at least two elements 245, 250 are situated inside free faces 220 and 225 of the component 215; however they could also be situated outside free faces 220 and 225 of the component 215. The prior art shield clip example of FIG. 1 can only function with a limited range of component 115 thicknesses between the two elements 120, 125 since the two elements are situated on the same base 130, and can only undergo a certain amount of deformation before the shield clip will no longer function. The embodiment in which the at least two elements 245, 250 are solely internal to the component has further advantages over arrangements such as those of FIG. 1 in that less space is needed on the PCB to accommodate the walls of the shield can since there is no requirement for an element 245, 250 to be situated on both sides of a shield can wall.

Figure 5:
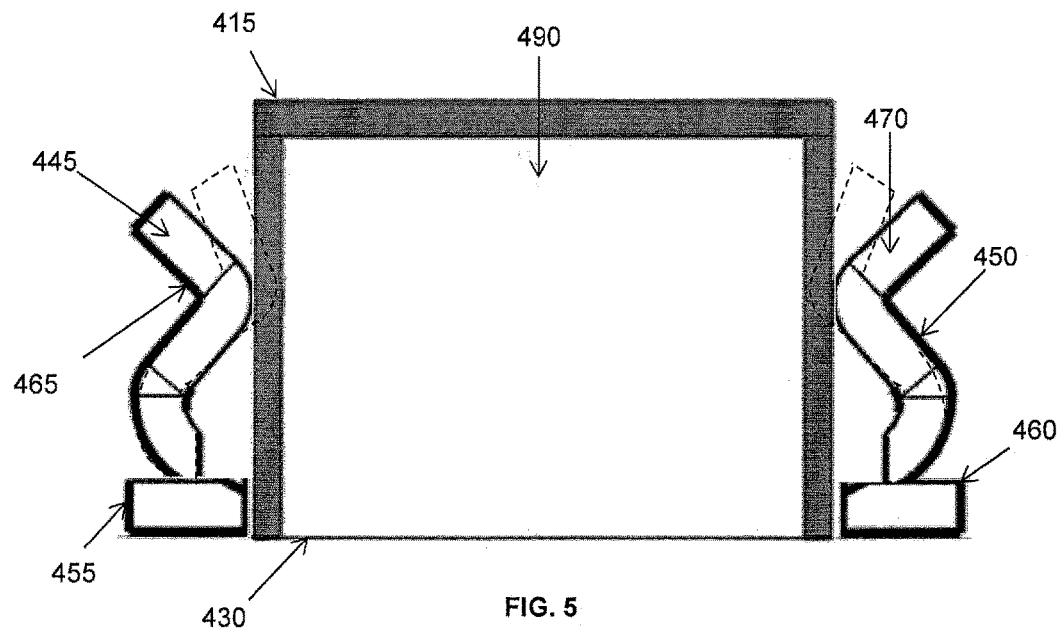
FIG. 5 is a spring pressure clip arrangement in accordance with yet another embodiment.

In embodiments where the at least two elements 245, 250 are situated solely external to the at least two free faces 220, 225 of the component 215, as best seen in FIG. 5, the shortest distance between the at least two elements 245, 250 when in the first position (as shown by the phantom lines) is less than the distance between the respective outer free faces 220, 225 of the component 215. This feature ensures that the elements 245, 250 must move to position the component 215; the feature also ensures that the elements are biased towards a position beyond the outer free faces 220, 225 so as to exert the biasing force X. Conversely, in embodiments where the at least two elements 245, 250 are situated solely within the at least one cavity of the component 215, the furthermost distance between each element in the first position is greater than the distance between the respective inner free faces 220, 225 of the component 215 defining the at least one cavity. Again, this feature ensures that the elements must move in order to position the component 215; the feature also ensures that the elements are biased towards a position beyond the inner free faces 220, 225 so as to exert the biasing force X. In both the above embodiments, a greater retention force Y will be achieved where the at least two free faces 220, 225 are positioned closer to the edges of the at least two bases 235, 240, since this causes the at least two elements 245, 250 to move the greatest distance from the first position.

Figure 6:
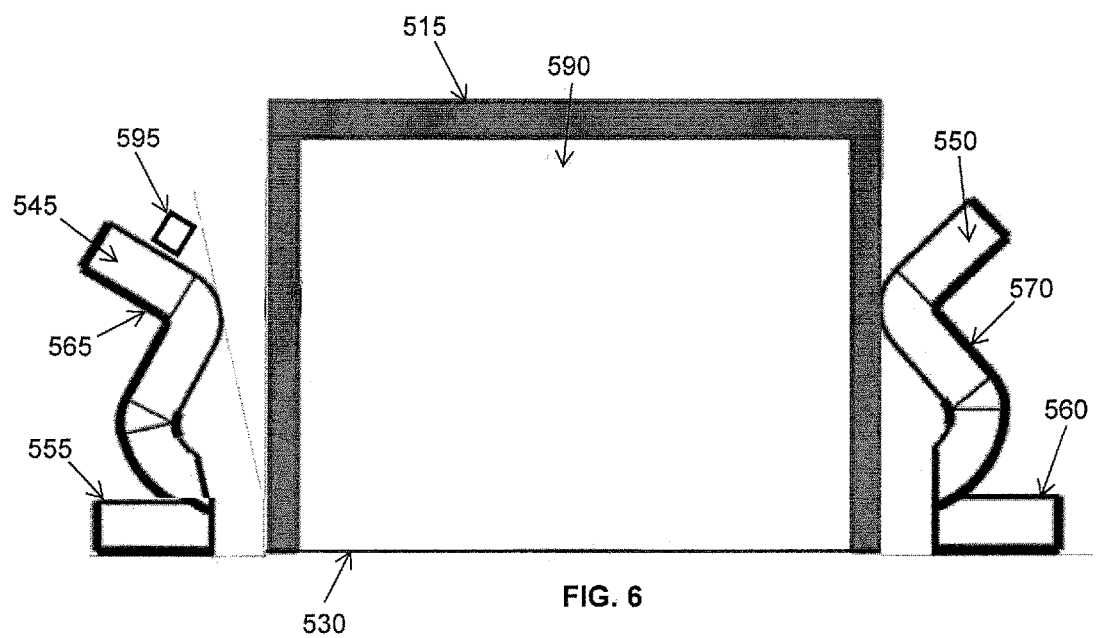
FIG. 6 is a spring pressure clip arrangement in accordance with still another embodiment.

In other embodiments, as best seen in FIG. 6, at least one of the at least two elements 245, 250 may be compressed or tensioned in a second position prior to retention of the component 215 which may be released with the component 215 in position on the surface 230 applying the biased force X to at least one of the at least two free faces of the component 215 in the direction of the first position. In some embodiments, the at least two elements 245, 250 may be latched in a second position by a latch 400 and released upon positioning of the component 215 onto the surface 230.

Numerous modifications, adaptations and variations to the embodiments described herein will become apparent to a person skilled in the art having the benefit of the present disclosure, and such modifications, adaptations and variations that result in additional embodiments of the present invention are also within the scope of the accompanying claims.

In addition to the claimed embodiments in the appended claims, the following is a list of additional embodiments which may serve as the basis for additional claims in this application or subsequent divisional applications:

Embodiment 1

A system for retaining a component to a surface, comprising: a surface; a component; and at least two elements, each element comprising a base connected to the surface, the at least two elements comprising means for retaining the component to the surface, wherein a first means is biased to a first position in which the first means extend beyond an edge of a first base such that when the component is placed on the surface the first means are configured to move to a second position in order to retain the component in its position relative to the surface.

Embodiment 2

A system according to embodiment 1, wherein the component comprises at least one cavity defined by at least two inner faces, and wherein upon placement of the component on the surface, the base of each element is situated solely within the at least one cavity of the component, wherein at least two bases are each situated adjacent to a respective inner faces of the component within the at least one cavity.

Embodiment 3

A system according to embodiment 2, wherein the furthermost distance between each means in the first position is greater than the distance between the respective inner faces of the component defining the at least one cavity.

Embodiment 4

A system according to any one of embodiments 2 or 3, wherein the retention force provided by the means on the component is dependent on the distance between the base of each element and their respective inner faces of the component.

Embodiment 5

A system according to any preceding embodiment, wherein base of a first of the at least two elements is connected to the base of a second of the at least two elements such that the base is a shared member by the first and second elements.

Embodiment 6

A system according to embodiment 1, wherein the component comprises at least two outer faces, and wherein upon placement of the component on the surface, the at least two bases are situated solely externally to the component, wherein at least two bases are situated adjacent to a respective outer face of the component.

Embodiment 7

A system according to embodiment 6, wherein the shortest distance between each means when in the first position is less than the distance between the respective at least two outer faces of the component.

Embodiment 8

A system according to any one of embodiments 6 or 7, wherein the retention force provided by the means onto the component is dependent on the distance between the at least two bases and their respective outer faces of the component.

Embodiment 9

A system according to any previous embodiment, wherein a second means is biased in a first position in which the second means extend beyond an edge of a second base such that when the component is placed on the surface the second means are configured to move to a second position in order to retain the component in its position relative to the surface.

Embodiment 10

A system according to any previous embodiment, where upon retention of the component, at least part of the component is in direct contact with the surface.

Embodiment 11

A system according to any previous embodiment, wherein the first base comprises: an edge traverse to the surface, and wherein the first means comprises: an element comprising a contact part, wherein the element is resiliently moveable such that the contact part is biased to a position beyond the edge of the first base.

Embodiment 12

A system according to embodiment 11, wherein upon contact of the component onto the surface, the element of the first base resiliently moves from the first position to the second position, wherein the element exerts a biased force on the component towards the first position.

Embodiment 13

A system according to embodiment 12, the element is latched in a second position prior to contact of the component onto the surface, such that when the component is in position upon the surface, the latch is releasable to allow the element to revert towards a first position so as to retain the component to the surface.

Embodiment 14

A system according to any one of embodiments 2-5, wherein a greater retention force is achieved where the at least two inner faces are position closer to the edges of the at least two bases.

Embodiment 15

A system according to any one of embodiments 6-8, wherein a greater retention force is achieved where the at least two outer faces are position closer to the edges of the at least two bases.

Embodiment 16

An element for use in the system of any preceding embodiment, the element comprising: a base connectable to a surface: and means for retaining a component to the surface, wherein the means is biased to a first position in which a portion of the means extends beyond an edge of the base such that when a component is placed on the surface to which the base is connectable, the means is configured to move to a second position in order to retain the component in its position relative to the surface.

Embodiment 17

An element according to embodiment 16, wherein the base comprises an edge traverse to the surface.

Embodiment 18

An element according to embodiment 16 or 17, wherein the retaining means comprises an arm, the arm comprising a contact part, wherein the arm is resiliently moveable such that the contact part is biased to the first position which is beyond the edge of the base.

Embodiment 19

A method for retaining a component to a surface, comprising: providing at least two elements, each element comprising a base connected to a surface, and means biased to a first position said first position extending beyond an edge of the first base; retaining a component on the surface by positioning the component so as to abut the biased means of each of the two elements and move the biased means to a second position in order to retain the component in a position relative to the surface.

The invention claimed is:

1. A system for retaining a component to a surface, comprising:
   a surface;
   a component; and
   at least two elements, each element comprising a base connected to the surface, the at least two elements comprising a first retaining portion biased to a first position in which the first retaining portion extends beyond an edge of a first base such that when the component is placed on the surface the first retaining portion is configured to move to a second position in order to retain the component in its position relative to the surface,
   wherein the component comprises at least one cavity defined by at least two inner faces, and wherein upon placement of the component on the surface, the base of each element is situated solely within the at least one cavity of the component, wherein the at least two bases are each situated adjacent to respective inner faces of the component within the at least one cavity.

2. The system according to claim 1, wherein the furthermost distance between the first retaining portion of one of the at least two elements in the first position and another one of the at least two elements is greater than the distance between the respective inner faces of the component defining the at least one cavity.

3. The system according to claim 1, wherein the retention force provided by the first retaining portion on the component is dependent on the distance between the base of each element and their respective inner faces of the component.

4. The system according to claim 1, wherein the base of a first of the at least two elements is connected to the base of a second of the at least two elements such that the base is a shared member by the first and second elements.

5. The system according to claim 1, wherein the component comprises at least two outer faces, and wherein upon placement of the component on the surface, the at least two bases are situated solely externally to the component, wherein the at least two bases are situated adjacent to a respective outer face of the component.

6. The system according to claim 5, wherein the shortest distance between the first retaining portion of one of the at least two elements in the first position and another one of the at least two elements is less than the distance between the respective at least two outer faces of the component.

7. The system according to claim 5, wherein the retention force provided by the first retaining portion onto the component is dependent on the distance between the at least two bases and their respective outer faces of the component.

8. The system according to claim 5, wherein a greater retention force is achieved where the at least two outer faces are position closer to the edges of the at least two bases.

9. The system according to claim 1, wherein a second retaining portion is biased in a first position in which the second retaining portion extends beyond an edge of a second base such that when the component is placed on the surface the second retaining portion is configured to move to a second position in order to retain the component in its position relative to the surface.

10. The system according to claim 1, where upon retention of the component, at least part of the component is in direct contact with the surface.

11. The system according to claim 1, wherein the first base comprises:
    an edge traverse to the surface, and
    wherein the first retaining portion comprises:
       an element comprising a contact part, wherein the element is resiliently moveable such that the contact part is biased to a position beyond the edge of the first base.

12. The system according to claim 11, wherein upon contact of the component onto the surface, the element of the first base resiliently moves from the first position to the second position, wherein the element exerts a biased force on the component towards the first position.

13. The system according to claim 12, the element is latched in a second position prior to contact of the component onto the surface by a latch, such that when the component is in position upon the surface, the latch is releasable to allow the element to revert towards a first position so as to retain the component to the surface.

14. The system according to claim 1, wherein a greater retention force is achieved where the at least two inner faces are position closer to the edges of the at least two bases.

15. An element for use in the system of claim 1, the element comprising:
    a base connectable to a surface: and
    a retaining portion for retaining a component to the surface, wherein the retaining portion is biased to a first position in which a portion of the retaining portion extends beyond an edge of the base such that when a component is placed on the surface to which the base is connectable, the retaining portion is configured to move to a second position in order to retain the component in its position relative to the surface.

16. The element according to claim 15, wherein the base comprises an edge traverse to the surface.

17. The element according to claim 15, wherein the retaining portion comprises an arm, the arm comprising a contact part, wherein the arm is resiliently moveable such that the contact part is biased to the first position which is beyond the edge of the base.

18. A method for retaining a component to a surface, comprising:
    providing at least two elements, each element comprising a base connected to a surface, the at least two elements comprising a first retaining portion biased to a first position said first position extending beyond an edge of the first base;
    retaining a component on the surface by positioning the component so as to abut the biased first retaining portion of one of the at least two elements and another one of the at least two elements and move the biased first retaining portion to a second position in order to retain the component in a position relative to the surface,
    wherein the component comprises at least one cavity defined by at least two inner faces, and wherein upon placement of the component on the surface, the base of each element is situated solely within the at least one cavity of the component, wherein at least two bases are each situated adjacent to respective inner faces of the component within the at least one cavity.

\* \* \* \* \*